United States Patent
Huang et al.

(10) Patent No.: US 8,604,498 B2
(45) Date of Patent: Dec. 10, 2013

(54) SINGLE PHOSPHOR LAYER PHOTONIC DEVICE FOR GENERATING WHITE LIGHT OR COLOR LIGHTS

(75) Inventors: Hsin-Chieh Huang, Hsinchu (TW);
Chao-Hsiung Wang, Hsinchu (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 169 days.

(21) Appl. No.: 12/732,437

(22) Filed: Mar. 26, 2010

(65) Prior Publication Data

US 2011/0233575 A1    Sep. 29, 2011

(51) Int. Cl.
*H01L 33/00*    (2010.01)

(52) U.S. Cl.
USPC ..................................... 257/98; 257/E33.061

(58) Field of Classification Search
None
See application file for complete search history.

(56) References Cited

U.S. PATENT DOCUMENTS

| | | | |
|---|---|---|---|
| 5,952,681 A * | 9/1999 | Chen | 257/89 |
| 6,329,676 B1 * | 12/2001 | Takayama et al. | 257/95 |
| 6,787,999 B2 | 9/2004 | Stimac et al. | |
| 7,350,933 B2 | 4/2008 | Ng et al. | |
| 2002/0074552 A1 * | 6/2002 | Weeks et al. | 257/76 |
| 2002/0117681 A1 * | 8/2002 | Weeks et al. | 257/106 |
| 2003/0015721 A1 * | 1/2003 | Slater et al. | 257/99 |
| 2005/0194605 A1 * | 9/2005 | Shelton et al. | 257/99 |
| 2006/0011913 A1 * | 1/2006 | Yamazaki | 257/59 |
| 2007/0223219 A1 * | 9/2007 | Medendorp et al. | 362/231 |

* cited by examiner

*Primary Examiner* — Michael Lebentritt
*Assistant Examiner* — Kevin Quinto
(74) *Attorney, Agent, or Firm* — Haynes and Boone, LLP

(57) ABSTRACT

A photonic device generates light from a full spectrum of lights including white light. The device includes two or more LEDs grown on a substrate, each generating light of a different wavelength and separately controlled. A light-emitting structure is formed on the substrate and apportioned into the two or more LEDs by etching to separate the light-emitting structure into different portions. At least one of the LEDs is coated with a phosphor material so that different wavelengths of light are generated by the LEDs while the same wavelength of light is emitted from the light-emitting structure.

19 Claims, 18 Drawing Sheets

SINGLE PHOSPHOR LAYER PHOTONIC DEVICE FOR GENERATING WHITE LIGHT OR COLOR LIGHTS

FIELD OF THE INVENTION

The present disclosure relates generally to a semiconductor device, and more particularly, to an integrated photonic device.

BACKGROUND

A light-emitting device (LED), as used herein, is a semiconductor light source including a light emitting diode and optionally photoluminescence material, also referred to herein as phosphor, for generating a light at a specified wavelength or a range of wavelengths. LEDs are traditionally used for indicator lamps, and are increasingly used for displays. An LED emits light when a voltage is applied across a p-n junction formed by oppositely doping semiconductor compound layers. Different wavelengths of light can be generated using different materials by varying the bandgaps of the semiconductor layers and by fabricating an active layer within the p-n junction. The applied voltage controls the intensity of the light. Additionally, the optional phosphor material changes the properties of light generated by the LED.

In LED displays, multiple LEDs are often used in to form a color image pixel. In one example, three separate light sources for red, green, and blue in separate LEDs having different compositions, individual optics and control are grouped or driven together to form one pixel. The pixel can generate a full spectrum of colors when individual LEDs are activated and controlled. As this display ages, the white point of the display can move as the different color LEDs age at different rates. Also the display resolution is low because one pixel includes three or more separate LEDs and their associated optics and circuitry.

An LED can also be used to generate white light. A white light LED usually generates a polychromatic light through the application of several phosphors, either in a mixture or several phosphor layers. The phosphors Stokes shift blue light or other shorter wavelength light to a longer wavelength. The perception of white may be evoked by generating mixtures of wavelengths that stimulate all three types of color sensitive cone cells (red, green, and blue) in the human eye in nearly equal amounts and with high brightness compared to the surroundings in a process called additive mixing. The white light LED may be used as lighting, such as back lighting for various display devices, commonly in conjunction with a liquid crystal display (LCD). There are several challenges with LED backlights. Good uniformity is hard to achieve in manufacturing and as the LEDs age, with each LED possibly aging at a different rate. Thus it is common to see color temperature or brightness changes in one area of the screen as the display age with color temperature changes of several hundreds of Kelvins being recorded.

Higher display resolution and consistent aging are increasingly required of LED displays. An LED design that allows high resolution color displays without an LCD and/or allows adjustment to ensure uniform color temperature after manufacturing and as the white LED ages is sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
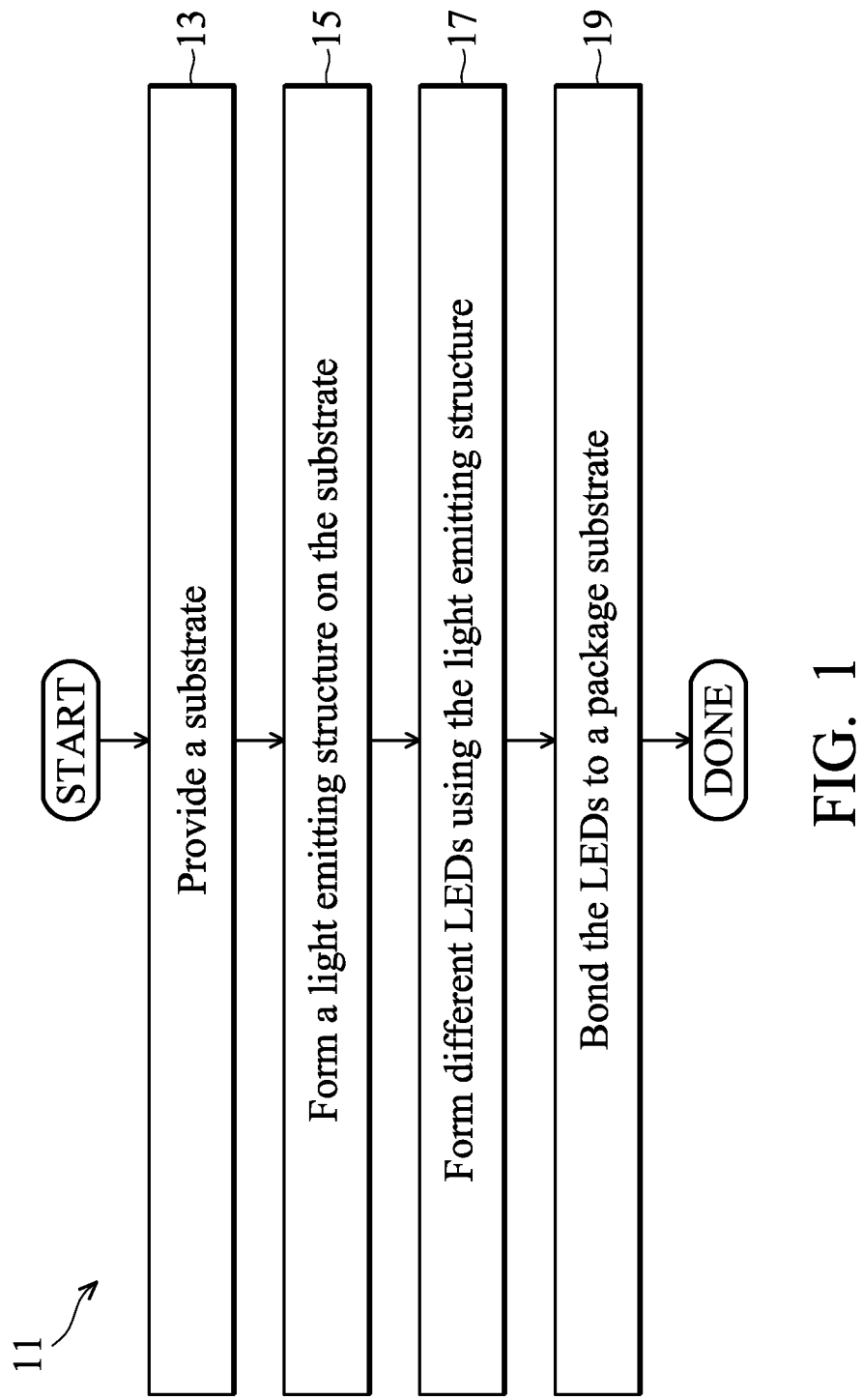
FIGS. 1 and 2 are flowcharts illustrating a method of fabricating an integrated photonic device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
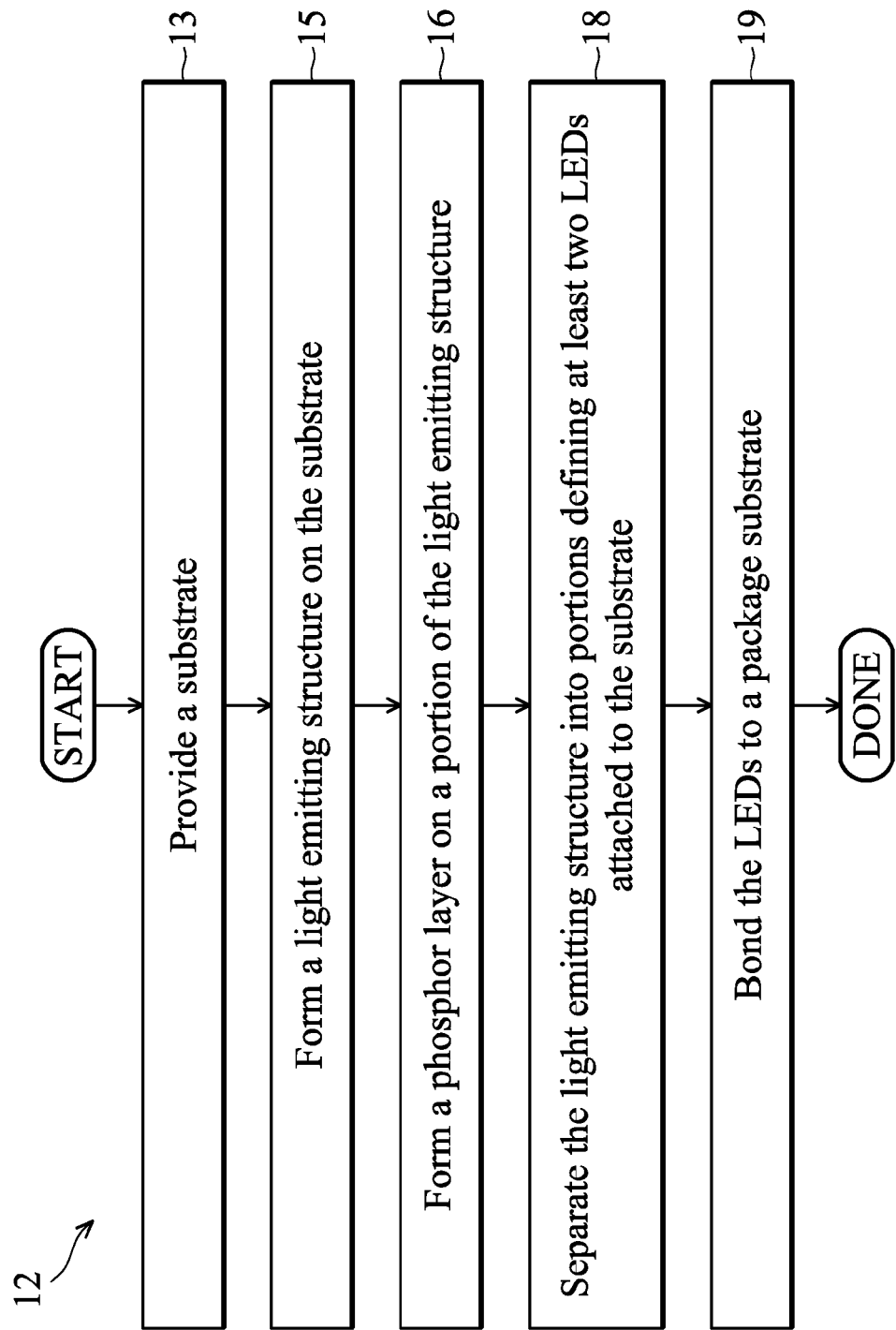
Figure 3:
FIGS. 3-5B illustrate various views of the integrated photonic device at various stages of fabrication according to certain embodiments of the method of FIGS. 1 and 2; and, FIGS. 6A-6D show top-view configurations of various multiple-LED dies in accordance with various embodiments.
Figure 4:
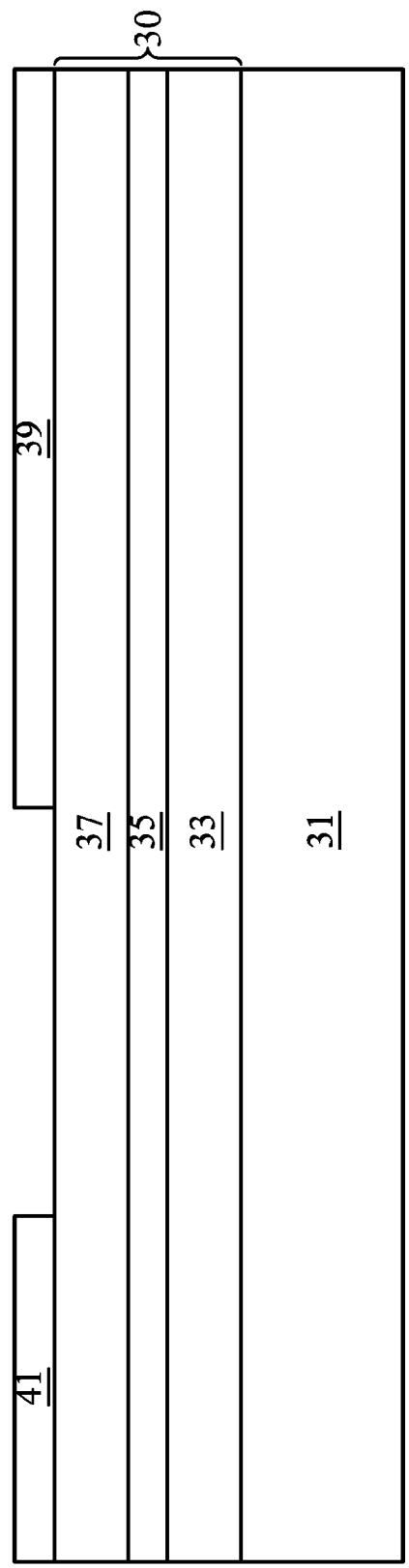

Illustrated in FIGS. 1 and 2 are flowcharts of methods 11 and 12 for fabricating an integrated photonic device in accordance with the present disclosure. FIGS. 3-5 are diagrammatic fragmentary views of the integrated photonic device during various fabrication stages in accordance with some embodiments of the present disclosure. As used herein, the integrated photonic device has one or more LEDs that can be controlled separately and is made from one die. The LEDs may be grouped into pixels. The photonic device may include one or several pixels. The photonic device may be a part of a display or lighting device having a number of the photonic devices, the photonic devices either controlled singly or in combination. The photonic device may also be a part of an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that various figures have been simplified for a better understanding of the inventive concepts of the present disclosure. Accordingly, it should be noted that additional processes may be provided before, during, and after the methods of FIGS. 1 and 2, that some other processes may only be briefly described, and various known processes may be substituted for the described processes to achieve the same effect.

Referring to FIG. 1, the method 11 begins with block 13 in which a substrate is provided. The substrate includes a material that is suitable for growing a light-emitting structure. Thus, the substrate may also be referred to as a growth substrate or a growth wafer. In one embodiment, the substrate includes sapphire. In other embodiments, the substrate may include silicon carbide, silicon, or another suitable material for growing the light-emitting structure. A light-emitting structure is formed on the substrate in operation 15. The light-emitting structure is usually a light emitting diode. A light-emitting device (LED), as used herein, includes a light emitting diode, at least one electrode for controlling the light emitting diode, and optionally phosphor material for shifting the wavelength of the light emitted by the diode.

FIG. 3 shows the light-emitting structure 30 on the substrate 31. A light-emitting structure 30 is formed over the substrate 31. In the present embodiment, the light-emitting structure 30 that has a doped layer 33, a multiple quantum well layer (MQW) 35, and a doped layer 37. The doped layers 33 and 37 are oppositely doped semiconductor layers. In some embodiments, the doped layer 33 includes an n-type gallium nitride material, and the doped layer 37 includes a p-type material. In other embodiments, the doped layer 33 may include a p-type gallium nitride material, and the doped layer 37 may include an n-type gallium nitride material. The MQW layer 35 shown in FIG. 3 includes alternating (or periodic) layers of active material, for example, gallium nitride and indium gallium nitride. For example, in one embodiment, the MQW layer 35 includes ten layers of gallium nitride and ten layers of indium gallium nitride, where an indium gallium nitride layer is formed on a gallium nitride layer, and another gallium nitride layer is formed on the indium gallium nitride layer, and so on and so forth.

In FIG. 3, the doped layer 33, the MQW layer 35, and the doped layer 37 are all formed by epitaxial growth processes known in the art. In the epitaxial growth processes, the substrate 31 acts as a seed crystal, and the layers 33, 35, and 37 take on a lattice structure and an orientation that are substantially identical to those of the substrate 31. After the completion of the epitaxial growth process, a p-n junction (or a p-n diode) is essentially formed by disposing the MQW layer 35 between the doped layer 33 and the doped layer 37. When an electrical voltage is applied between the doped layer 33 and the doped layer 37, an electrical current flows through the light-emitting structure 30, and the MQW layer 35 emits radiation. The color of the light emitted by the MQW layer 35 associated with the wavelength of the emitted radiation, which may be tuned by varying the composition and structure of the materials that make up the MQW layer 35.

The operation of forming a light-emitting structure 30 may optionally include the formation of additional layers not shown in FIG. 3. For example, a buffer layer may be included between the substrate and the first doped layer 33. A suitable buffer layer may be made of an undoped material of the first doped layer 33 or other similar material. For example, if the first doped layer is gallium nitride the buffer layer may be aluminum nitride. Additionally or alternatively, a reflective layer or an ohmic contact layer may be added above the doped layer 37. A light reflecting layer may be a metal, such as aluminum, copper, titanium, silver, silver, alloys of these, or combinations thereof. The light reflecting layer may be formed by a physical vapor deposition (PVD) process or a chemical vapor deposition (CVD) or other known deposition processes in the art. These other layers may be an indium tin oxide (ITO) layer.

Referring to FIG. 1, different LEDs are formed using the light-emitting structure in operation 17. The LEDs formed remain together on the same substrate, and are configured to be individually controlled. The LEDs include identical light-emitting structures, all of which were deposited in operation 15. Forming individual LEDs involve at least separating the light-emitting structure into different portions so that the light emission may be individually controlled by applied voltage across the light-emitting structure separately. Usually, but not always, each LED portion includes two electrodes and associated circuitry. In certain embodiments, one electrode may be shared among several LEDs.

At least one of the LEDs generates light of a different wavelength from the others. The light-emitting structures of the LEDs, formed simultaneously in the same operation, emit the same radiation, usually blue light or UV light. For at least one LED the light emitted is converted to another wavelength through the use of a photoluminescence material, usually a phosphor. Thus one of the LEDs is said to generate light of a different wavelength from the others while all of the LEDs have active layers that emit the same light. Various phosphors are known to convert light to different wavelengths.

A particular feature of having the same light-emitting structure among the LEDs is improved uniformity in manufacturing and aging and compared to conventional image pixels that include several separately manufactured LEDs. While uniformity may vary across different wafer or one wafer during manufacturing, locations on the wafer very close to each other see little variation in materials formed. When multiple LEDs are used in conventional image pixels, for example, a red, green, and a blue LED cluster, the LEDs may include different layers manufactured at different times from different wafers. Because they were manufactured separately, each LED may react to operating conditions differently and thus have different aging characteristics. According to various embodiments of the present invention, forming the LEDs on the same substrate from a light-emitting structure ensures that the light-emitting structure material characteristics are as close as possible, reducing the likelihood that the LEDs age differently.

In certain embodiments, two LEDs are formed from the light-emitting structure. One LED may generate blue light and the other may generate yellow light. Seen together, white light is perceived. The blue light may be generated directly from the active layer emitting blue light or converted from another color light through a phosphor, for example, UV light to blue light. The yellow light may be generated by converting a blue light or UV light.

In various embodiments, three LEDs are formed from the light-emitting structure, generating blue, green, and red light. Seen together, white light is also perceived. The blue light may be generated directly from the active layer emitting blue light or converted from another color light through a phosphor, for example, UV light to blue light. The green and red lights may be generated by converting a blue light or UV light.

The LEDs formed from the light-emitting structure may be controlled individually. By controlling the voltage applied to the LEDs, different intensities of different color lights are generated. Combination of these colors can be used to generate a full spectrum of color lights in addition to generating white light. One skilled in the art would appreciate that the concept may be used to generate a subset of the full spectrum of light by including different phosphors in the LEDs. This concept may even be broadened to include invisible light, for example, UV light may be passed through and converted in several LEDs to simulate sunlight in combination.

The operation 17 of forming different LEDs using the light-emitting structure may be achieved in a number of ways. Referring to FIG. 2, one embodiment of operation 17 in FIG. 1 is operations 16 and 18. In operation 16, a phosphor layer is formed on a portion of the light-emitting structure. The phosphor layer is shown as layer 39 in FIG. 4. Various techniques may be used to form the phosphor layer 39.

According to some embodiments, a phosphor layer may be deposited using conventional semiconductor techniques such as spin coating and chemical vapor deposition and then subsequently masked and removed in part to achieve phosphor layer 39. Phosphor material in a liquid may be applied evenly on the top layer of the light-emitting structure by spin coating. The coating may be cured by heating the wafer. The phosphor material may then be patterned using conventional lithographic process and a portion of the phosphor material may be removed by known etching methods.

Additional optional phosphor layers may be added on different portions of the light-emitting structure, for example, layer 41 of FIG. 4. In one example, the phosphor layers 39 and 41 include different phosphor material that can convert the light emitted by active layer 35 into different color light, e.g., red or green. Layer 41 may be deposited after layer 39 by an additional spin coating, patterning, and etching operation. Thus, multiple non-overlapping layers of phosphor material may be added individually.

According to other embodiments, the phosphor layer or layers may be applied using a printing method onto a wafer. Printing processes suitable for semiconductor processing is known in the field and details of which are not repeated herein. Generally, a pre-defined phosphor pattern is printed or bonded to the wafer, usually with some adhesive. The phosphor pattern may also be printed to the wafer in individual layers for each phosphor material.

Figure 5A:
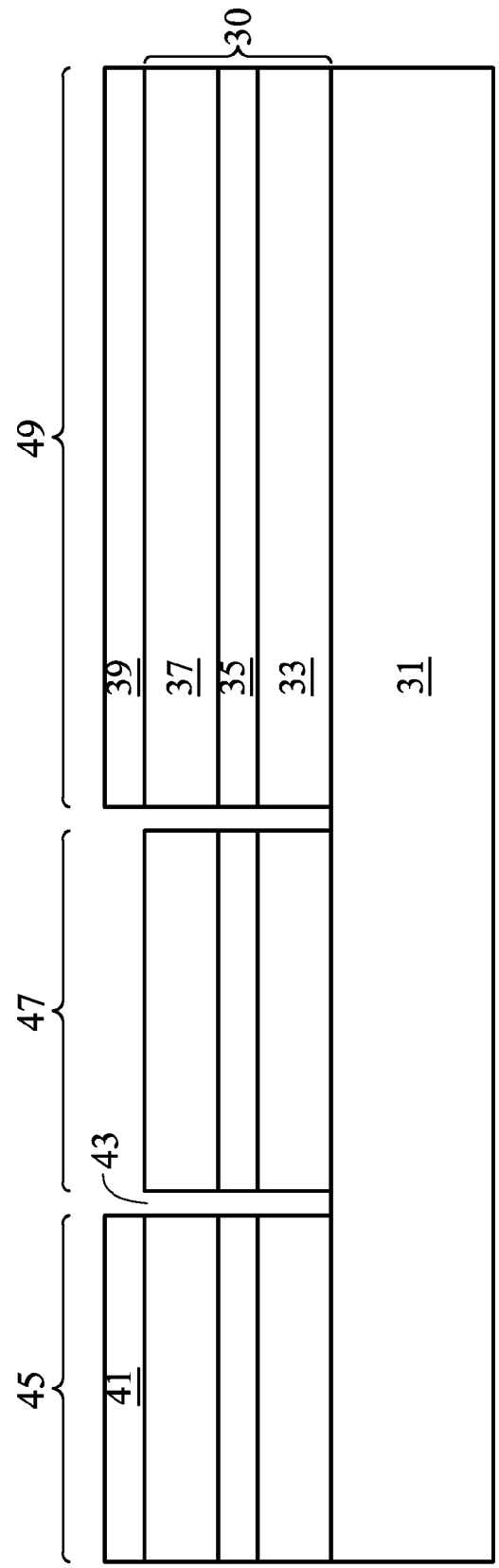

Referring to FIG. 2, the light-emitting structure is separated into portions defining at least two LEDs in operation 18. Preferably, each LED, in operation, would generate a different color light. FIG. 5A shows a light-emitting structure separated into three portions 45, 47, and 49 representing three LEDs. A trench 43, defining street lanes, is etched into the light-emitting structure to at least physically separate the active layer 35 and doped layer 37 into three portions. In certain embodiments, the trench 43 reaches the substrate through any intervening layers between the substrate 31 and the bottom doped layer 33. In other embodiments, the trench 43 may reach only an intervening layer, for example, a buffer layer. In embodiments where the LEDs share a bottom electrode, the trench 43 may reach a conductive layer such as an ohmic contact layer or the bottom doped layer 33. After the trench is etched, the sidewalls may be coated with an isolation material to ensure electrical insulation between neighboring LEDs. In certain embodiments, the trench may be filled with an insulating material.

Figure 5B:
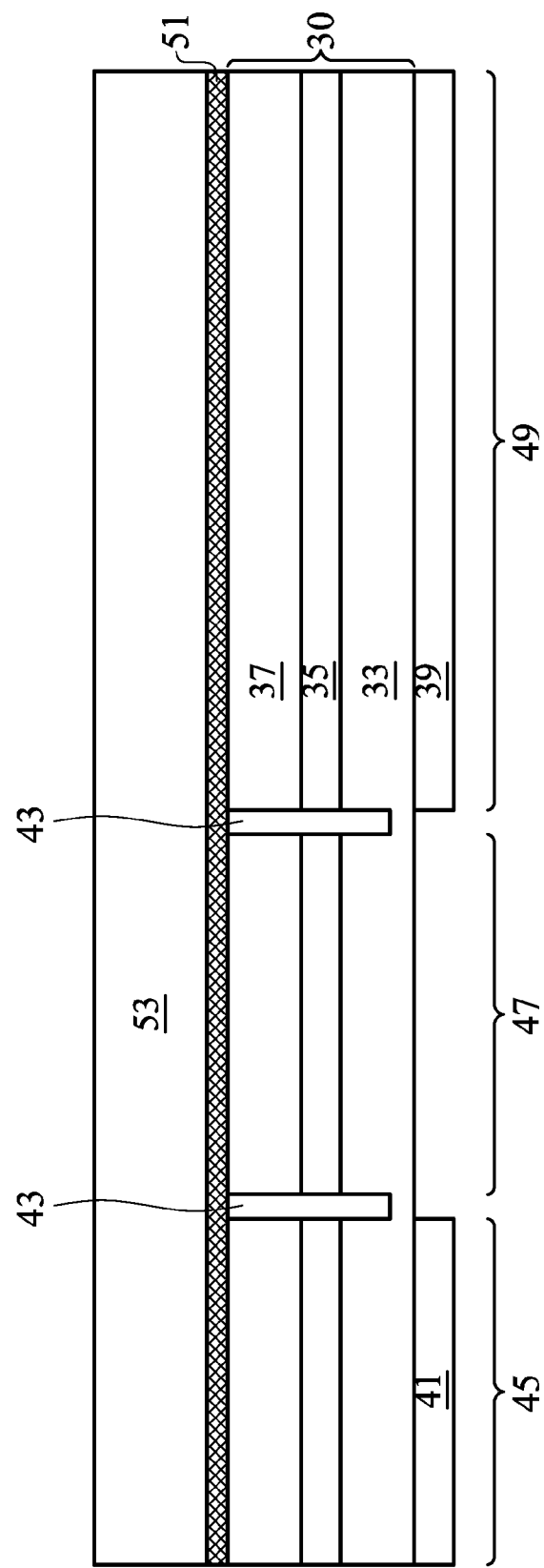

In certain embodiments, the growth substrate 31 of FIG. 5A is removed during the process of separating the light-emitting structure into portions defining at least two LEDs, as shown in FIG. 5B. A semiconductor substrate 53 is bonded to the light-emitting structure 30 on a surface opposite to the growth substrate via a bonding layer 51. Preferably but not necessarily, a reflecting layer or a minor layer (not shown) separates the bonding layer from the light-emitting structure 30. The growth substrate may then be removed.

Various methods are known to remove the growth substrate. In one example, an interface between the growth substrate and the first group-III/V compound layer (33) is treated with electromagnetic radiation (for example, laser), which decomposes the material at the interface. This interface may be a buffer layer or an undoped gallium nitride layer. The growth substrate, for example, sapphire, may be lifted off and removed.

After the growth substrate is removed, the phosphor layers 39 and 41 may be applied on the surface opposite of the semiconductor substrate 53. However, separating the light-emitting structure into various portions defining LEDs 45, 47, and 49 may occur before or after the growth substrate removal. The light-emitting structure 30 may be etched first to define street lanes 43 before the semiconductor substrate 53 is bonded. In these embodiments, the street lanes 43 separating the LED portions 45, 47, and 49 may or may not isolate the first doped layer 33. As shown in FIG. 5B, street lanes 43 separate the doped layer 37 and active layer 35 and do not penetrate the doped layer 33.

In other embodiments, the light-emitting structure is separated into different LED portions after the semiconductor substrate 53 is bonded to the light-emitting structure 30. The street lane openings would open from the doped layer 33 as opposed to doped layer 37 as shown in FIG. 5B.

Figure 6A:
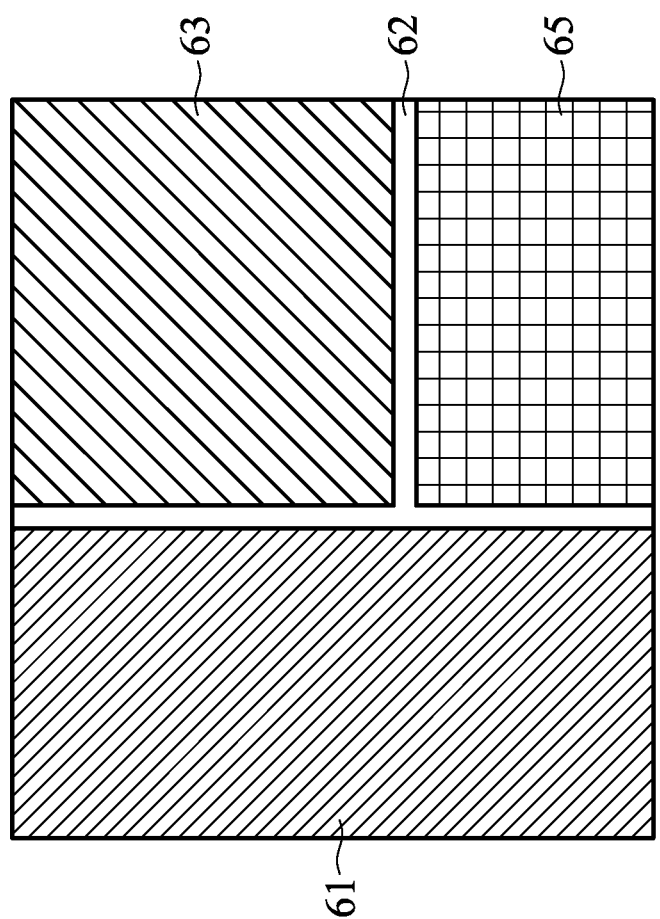
Figure 6B:
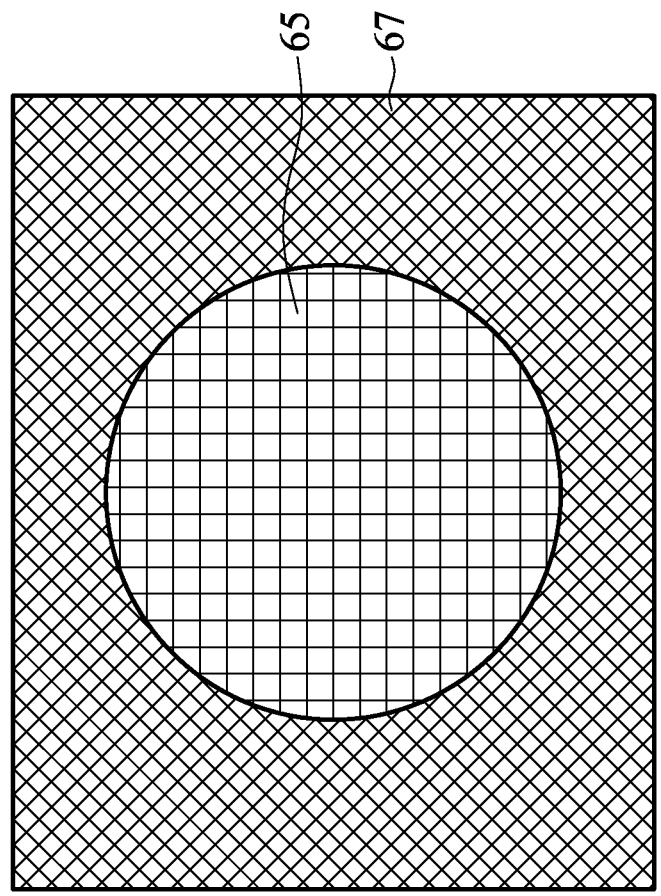
Figure 6C:
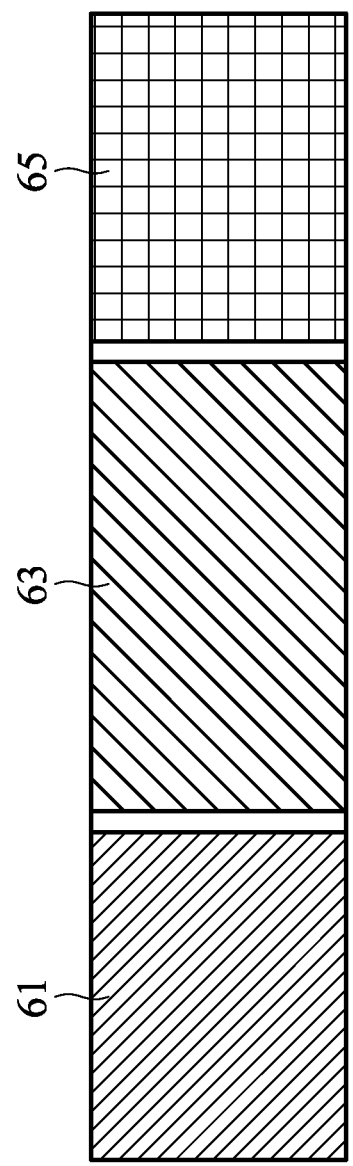
Figure 6D:
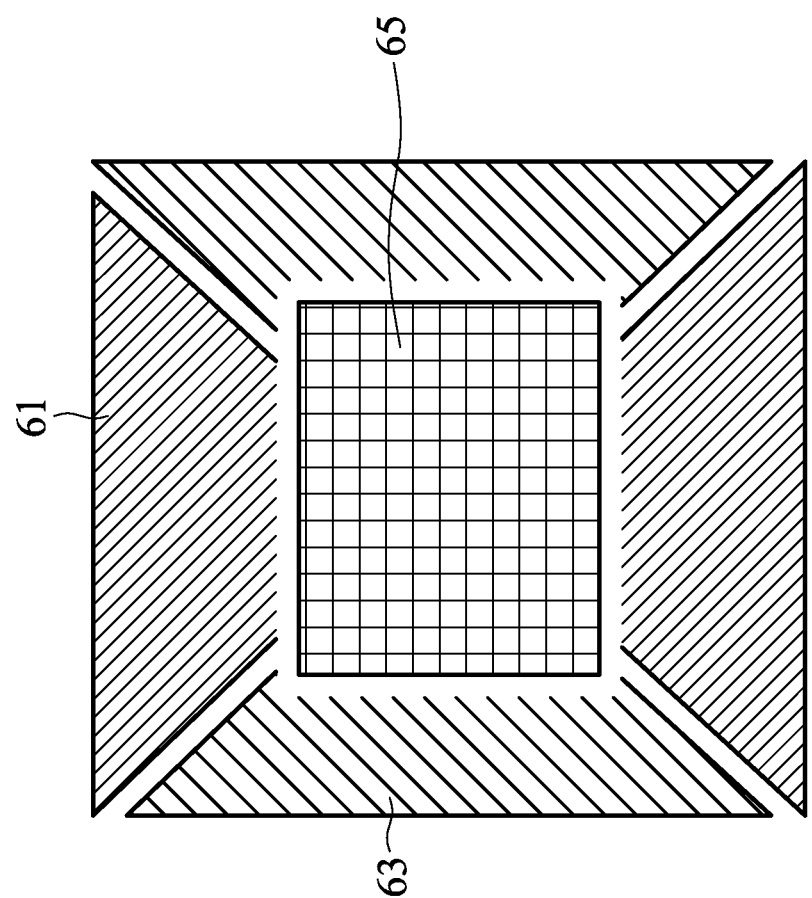

Using a photolithography process, the trench pattern for a single die can have many shapes and is not limited to straight lines as in the conventional LED making process. Each die having more than one LED is a multiple-LED die. Each die may be made into an integrated photonic device. FIGS. 6A to 6D shows a number of top-view configurations for multiple-LED dies. The surface area size for individual LEDs may be apportioned based on the final product design and materials used. For example, a 2-LED die for generating white light using blue and yellow lights may have LED area apportionment based on a desired white color temperature. In FIG. 6A, a 3-LED die is shown with red 61, green 63, and blue 65. As noted above in conjunction with FIG. 5, the boundaries 62 between LEDs are trenches, or street lanes, that separates the light-emitting structure of each LED. The red 61 portion shown is larger than that of green 63 or blue 65 individually. The actual apportionment design would depend on the property of the phosphor layer. It is noted that the light is emitted in all directions. Thus it is expected to have light emitting from the street lanes and edges of the die through the edges of the active layers. The LED apportionment on the die can take the edge emissions into account. For example, in FIG. 6B, a 2-LED die is shown with blue 65 and yellow 67. The design of 6B may be used where blue light emitted at the edge of the die is undesirable. So the yellow LED 67 is used to surround the blue die 65. FIG. 6C shows yet another configuration where the LEDs are lined up in a strip. The various colors could be in any arrangement of colors. The possibilities are many. In FIG. 6D, a 5-LED die is shown, each generating a different color. The wavelengths of the color generated in a multiple LED die can overlap or not. When some overlap is used, multiple LED dies may be used to generate nearly true white light. One application is full spectrum lighting where some UV is included to simulate sunlight. On the other hand, the 5-LED die of FIG. 6D may include repeating colors, for example, with two of the colors, red 61 and green 63 repeating at the same or slightly different wavelengths and separately controlled.

Once the light-emitting structure is separated into portions defining at least two LEDs attached to the substrate, electrical contacts may be formed on the LEDs to control the LEDs during operation. Preferably, the LEDs are individually controlled by at least one separate electrical contact. FIGS. 7A to 7E show different embodiments of electrical contacts using through-substrate vias (TSVs) and wires. Note that TSVs may be drilled or etched before, after, or along with the trenches separating LED portions. Methods of forming the appropriate structure are known in the art. One skilled in the arts would be able to appropriately design a manufacturing flow suitable for achieving a desired structure.

Figure 7A:
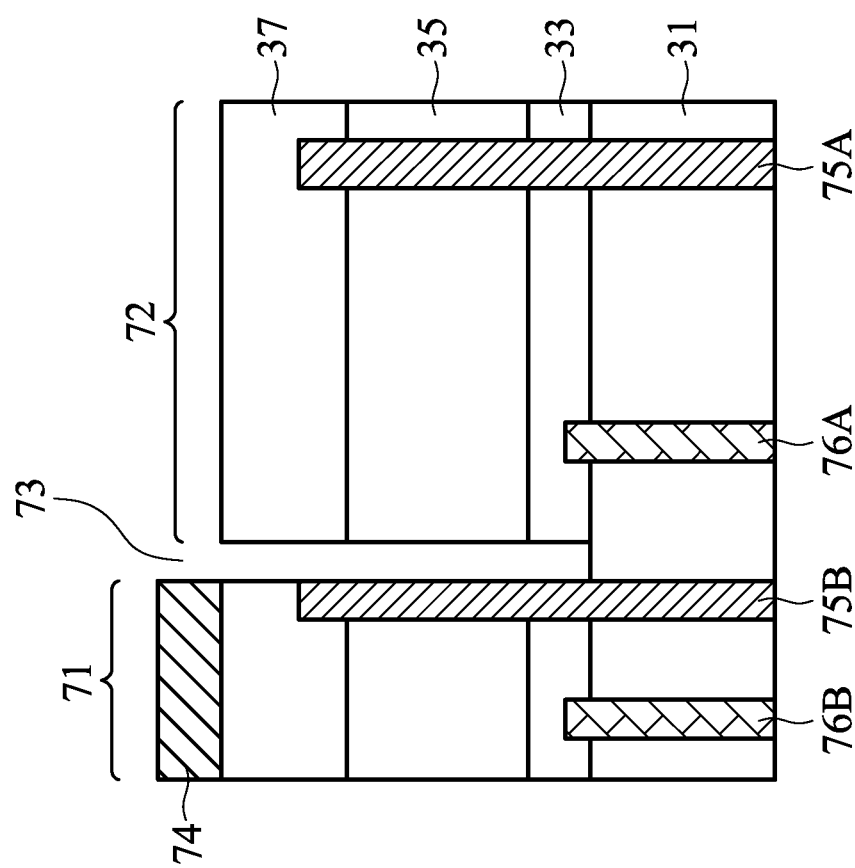
FIGS. 7A-7F show side-view configurations of various multiple-LED dies in accordance with various embodiments.

FIG. 7A shows two LEDs 71 and 72 separated by trench 73. LED 71 includes a phosphor layer 74. As shown, the doped layers 33 and 37 and active layer 35 are divided into two portions by trench 73. TSVs 75A, 75B, 76A, and 76B are formed from a back surface of substrate 31 into the light-emitting structure. In FIG. 7A, TSVs 75A and 75B extend past the active layer 35 into the doped layer 37. TSVs 75A and 75B are top TSVs. In various embodiments, TSVs 75A and 75B may extend past the doped layer 37 into an ohmic contact layer, an indium tin oxide (ITO), or an electrode layer. TSVs 75A and 75B are filled with an electrical conductor, for example, a metal to conduct electricity to the doped layer 37. The electrical conductor may be copper, aluminum, titanium, or any other commonly used conducting material in semiconductor manufacturing. The electrical conductor is insulated within the TSVs 75A and 75B from active layer 35 and first doped layer 33. The insulation may be accomplished by first coating the TSV with a dielectric material before depositing the conductor. Further details of using TSV in a LED is found in co-pending application Ser. No. 12/704,974 filed on Feb. 12, 2010 titled "Light Emitting Device with Through Via Connection," the disclosure of which is incorporated herein by reference in its entirety for all purposes.

TSVs 76A and 76B, as shown, extends through substrate 31 into the first doped layer 33. TSVs 76A and 76B are bottom TSVs. In other embodiments, TSVs 76A and 76B may not extend into the first doped layer 33 and instead stops at an intermediate layer, for example, a buffer layer (not shown). Similar to TSVs 75A and B, TSVs 76A and B may be appropriately insulated. In operation, voltage is applied across the active layer 35 through the TSVs. LED 71 is controlled through TSVs 75B and 76B. LED 72 is controlled through TSVs 75A an 76A. By varying the voltage, the light intensity emitted by the light-emitting structure for LEDs 71 and 73 are controlled. Together, the LEDs on the die generate a polychromatic light. The spectral distribution of light generated may be changed by changing the light intensity at individual LEDs 71 and 72. For example, in a 3-LED die having red, green, and blue LEDs, each of the color LED may be turned on and off individually to generate an entire spectrum of light from the single die. More subtle control of light intensities can adjust a color temperature of, for example, white light, to compensate for aging and manufacturing uniformity issues.

Figure 7B:
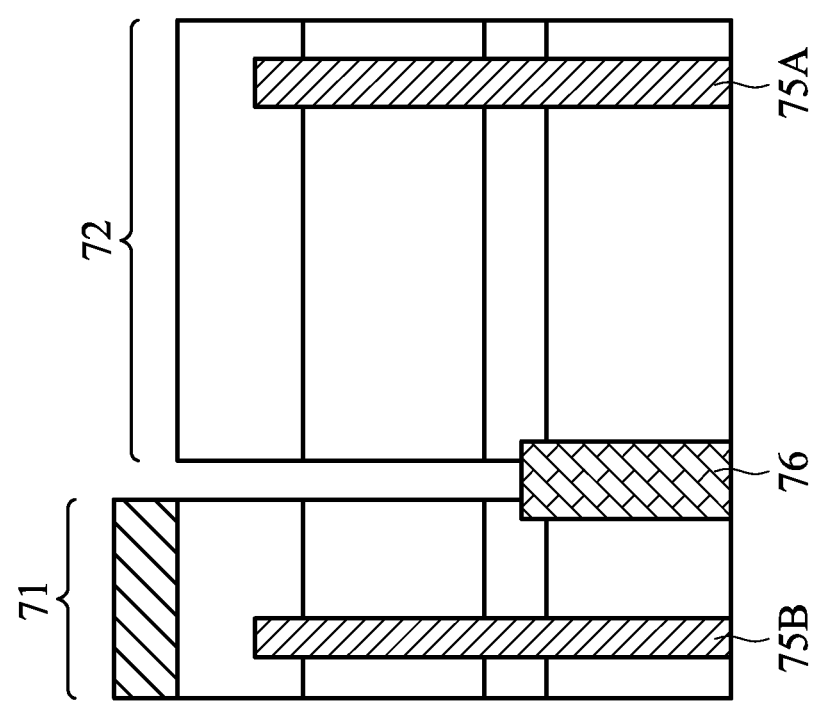

FIG. 7B shows a variation of FIG. 7A where TSVs 76A and 76B and combined, shown as TSV 76. The LEDs 71 and 72 of FIG. 7B can still be individually controlled by changing the voltage across 75A and 76 for LED 72 and across 75B and 76 for LED 71.

After the light-emitting structure is separated into LED portions, TSVs and electrodes are formed, in the LEDs or on the LEDs, respectively. The wafer is then diced or singulated along scribe lines into a number of multiple-LED dies. Referring back to FIGS. 1 and 2, after the LEDs are formed, the LEDs are bonded to a package substrate in operation 19. A package substrate includes terminals for connecting to LED electrodes. Package substrates can connect to the LED die via TSVs or external connections.

Figure 7C:
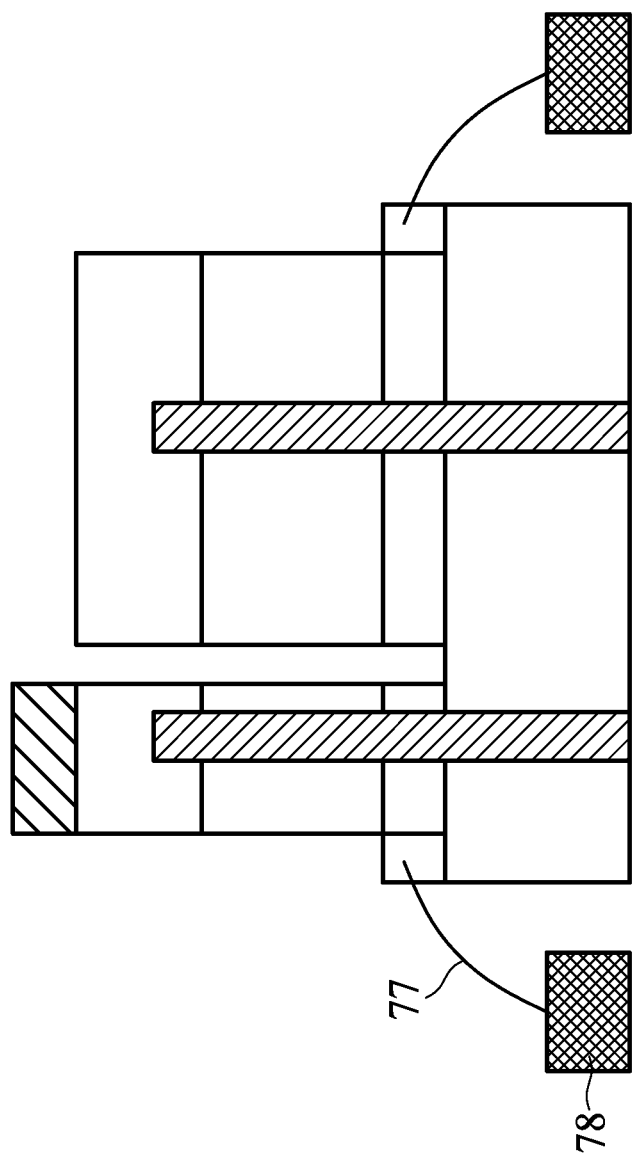
Figure 7D:
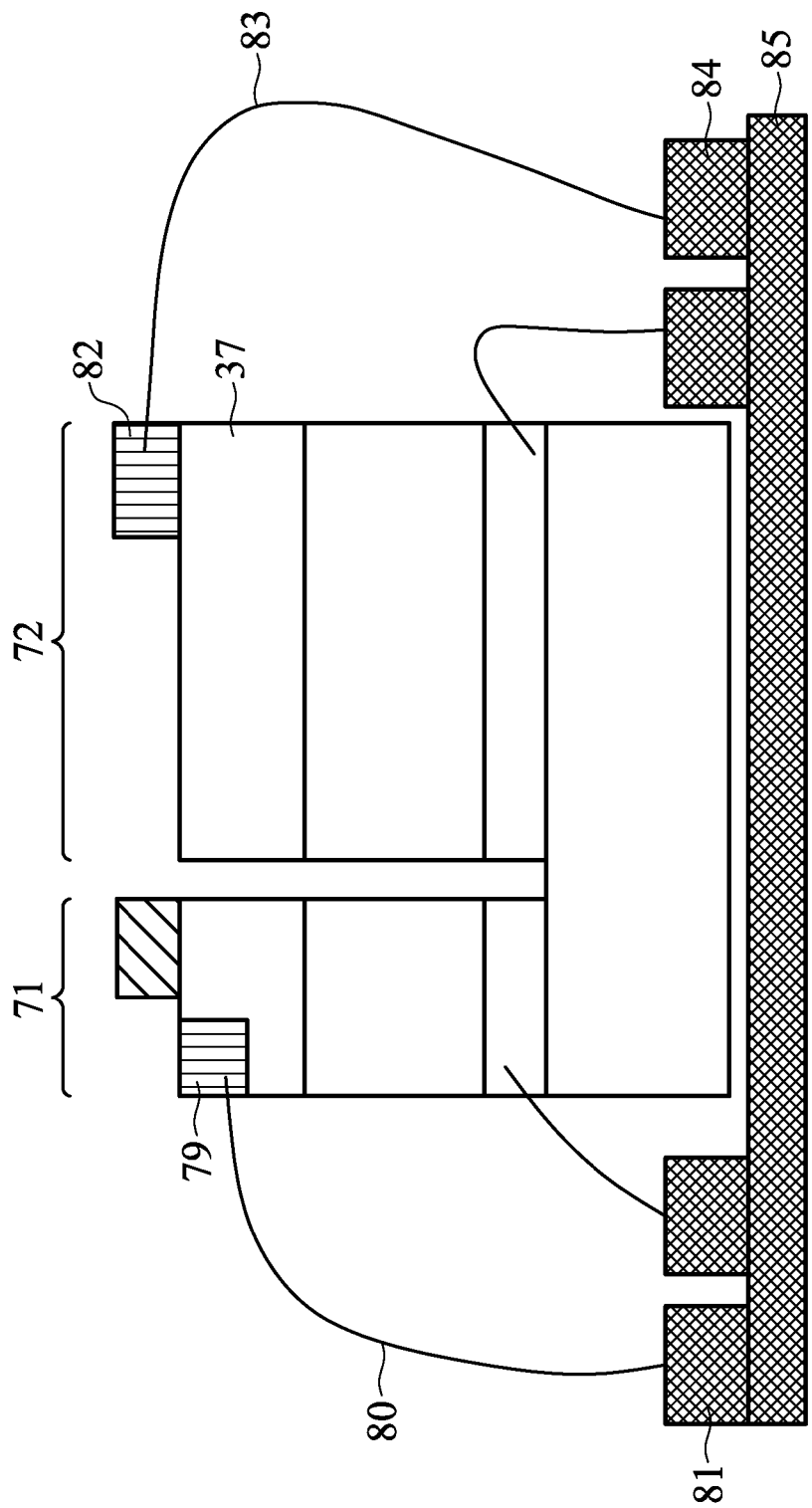

FIG. 7C shows embodiments where one of the electrodes 86 is externally connected via wire 77 to electrode 78 for LED 71. Note that the active layer area is reduced by having the external electrode 86. The FIG. 7D shows a configuration in accordance with some embodiments of the present invention where each LED 71 and 72 is externally connected to terminals on a package substrate 85. LED 71 is shown with an embedded electrode 79 connecting to terminal 81 via wire 80. LED 72, on the other hand, is shown with an electrode 82 that is above layer 37 connecting to terminal 84 via wire 83. Bonding wires 80 and 83 are well known in the art and may be gold or copper wires. Other types of wires made of other metals or alloys may also be used. The terminals 81 and 84 may be a part of a package substrate 85 to which the die is also attached. An adhesive or a bonding layer (not shown) may be used between the LED die and the package substrate 85.

Figure 7E:
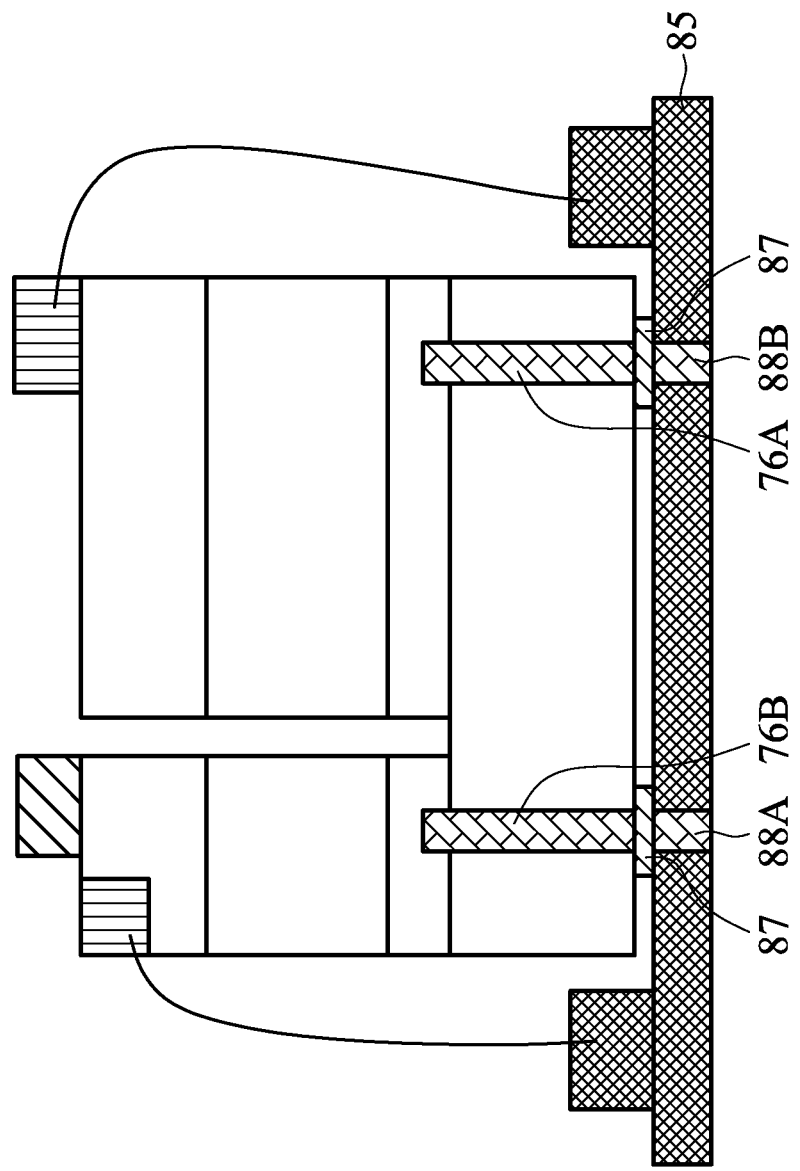

FIG. 7E shows yet another embodiment where one of the electrodes is internal and the other electrode is external. TSVs 76A and 76B connects to bonding pads 87 on the package substrate 85. From the package substrate 85, other TSVs 88A and 88B connect to external circuitry. In other examples, the bonding pads 87 extend horizontally across the package substrate to connect to external terminals on the package substrate. The bonding pad 87 may be replaced by various electrical connection structures such as solder bumps. In still other examples, the multiple-LED die is connected directly to the package substrate through electrostatic force without a bonding pad 87, or circuitry may be embedded in the package substrate 85.

Figure 7F:
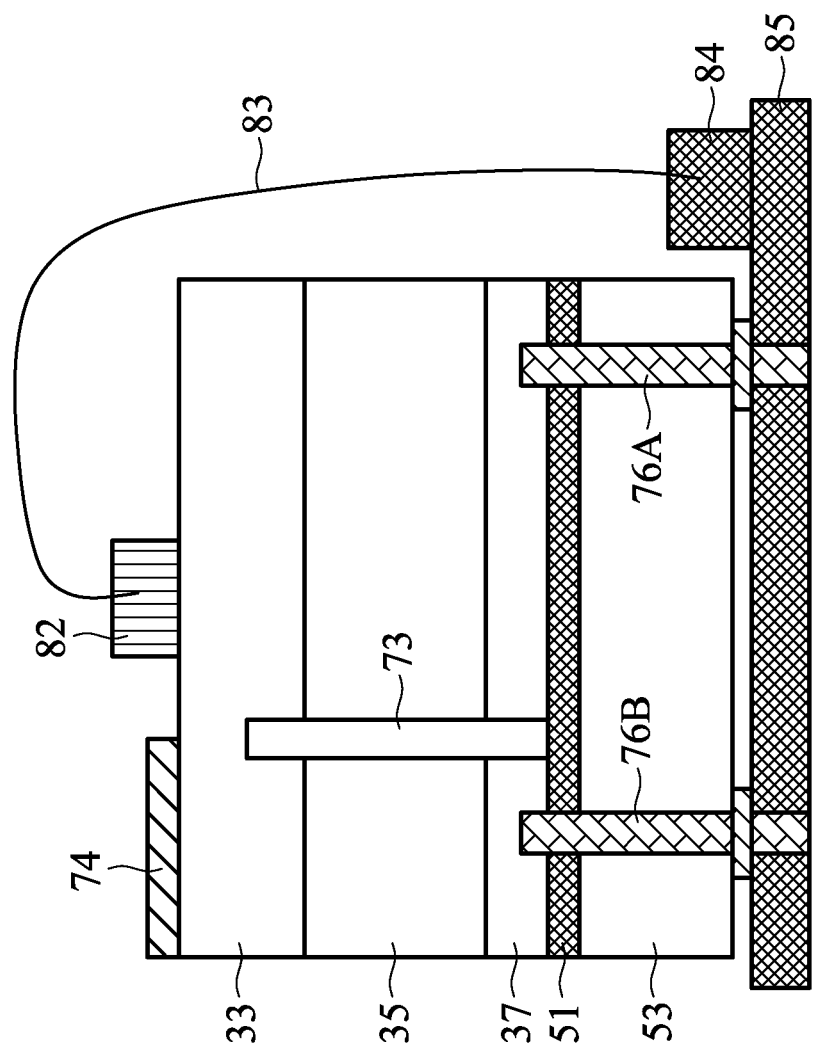

FIG. 7F shows an embodiment where the growth substrate is removed first as described with and shown in FIG. 5B. In FIG. 7F, TSVs 76A and 76B electrically connect to doped layer 37 and an electrode 82 connect to doped layer 33. The LED portions are separated by street lane 73, which is etched before the semiconductor substrate 53 is bonded via the bonding layer 51. A phosphor layer 74 covers a portion of the surface. The structure shown in FIG. 7F has the feature of maximizing the surface from which light is generated because no trench (street lanes) is formed on the surface. A variation of the structure shown as FIG. 7F may be that the street lane 73 penetrates layer 33. In this variation the street lane 73 may be etched from layer 37 before bonding the semiconductor substrate 53 or be etched from layer 33 after the growth substrate is removed. In some instances, it may be etched from one direction first and then the other.

In various embodiments, the multiple-LED dies shown in FIGS. 7A to 7F may be flipped before the electrodes are formed and package substrates bonded. Flipping the multiple-LED die may improve the light quality by re-positioning the elements that can block light into positions away from the intended direction of light. For example, a flipped product can include electrodes and wires attached to an underside of the multiple-LED die closest to the package substrate.

The LEDs are preferably covered with some optical elements, such as a lens. The entire multiple-LED die may be covered using one single lens. In some instances, each LED of the multiple-LED die may be protected with a lens separately. A lens is typically molded onto the completed die/package and maybe a transparent material, such as silicone or other plastics. Lens material may include dispersed particles with desirable optical properties, such as filters, diffusers, and reflectors.

Lens material may also include photoluminescence material, such as a phosphor. Such material may be embedded in the lens material or coated onto an interior surface of the structure. In accordance with various embodiments, a multiple-LED die may include a kind phosphor on one or more LEDs on the die and a different kind of phosphor in the lens to achieve a desired effect. For example, the light-emitting structure may emit a UV light that is converted to blue light from phosphor in the lens material, while LED portions convert the UV light to red and green light which pass through the lens material. Together, these lights are perceived as white color light.

The embodiments discussed above in association with FIGS. 1 to 7E allow for integration of multiple-LED photonic devices at a die level. The use of single substrate for multiple LEDs not only reduces dimensions but also promotes uniformity across each light source. Separate controls for each LED extends the useful life for display products as color temperature shifts can be compensated. These multiple-LED dies can be used as displays, for example, LED TV, without using a LCD. Because the LEDs are apportioned using photolithographic processes, traditional cutting limitations of using straight lines no longer apply. Display designers can make unique LED shapes to achieve various effects. Additionally, fabrication processes that occur after the integration, including chip processes and package processes, can be done at the wafer level with mature silicon technologies.

Figure 8A:
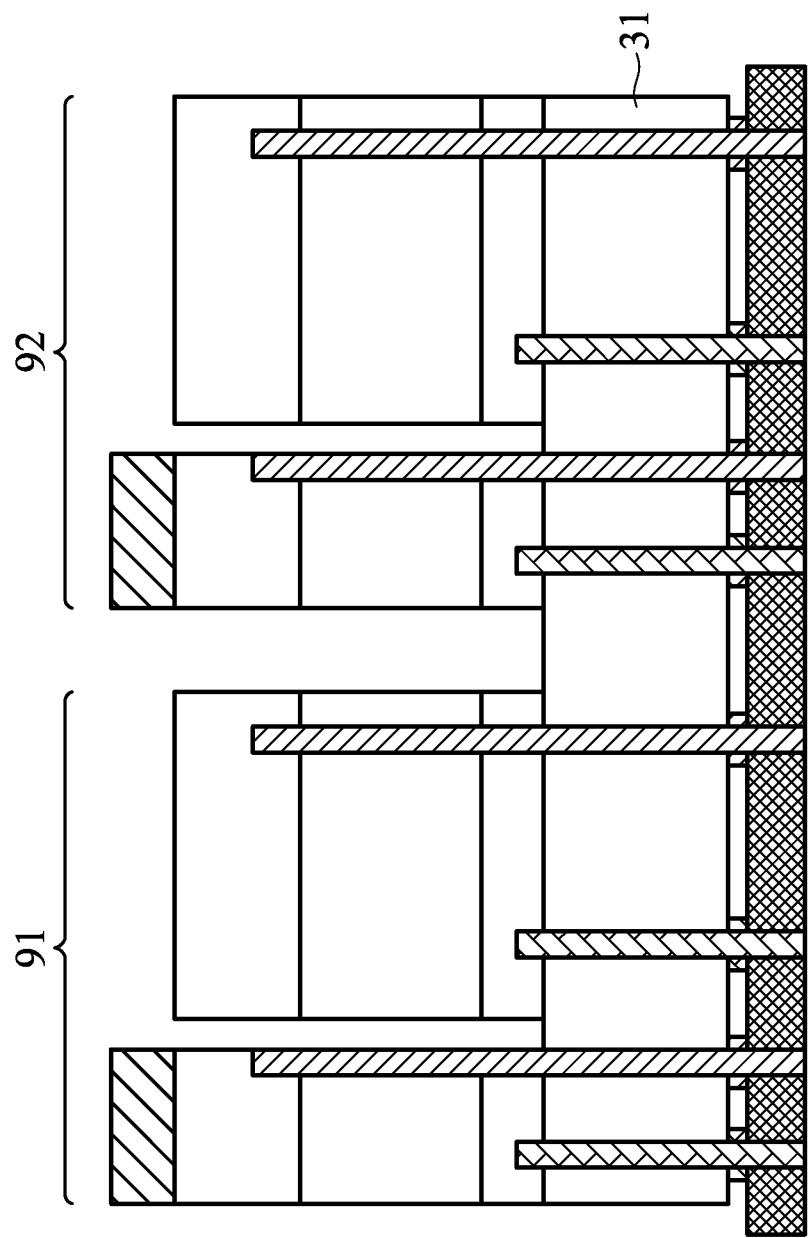
FIGS. 8A-8B show a side view and a top view configuration of a multiple-pixel die in accordance with various embodiments.
Figure 8B:
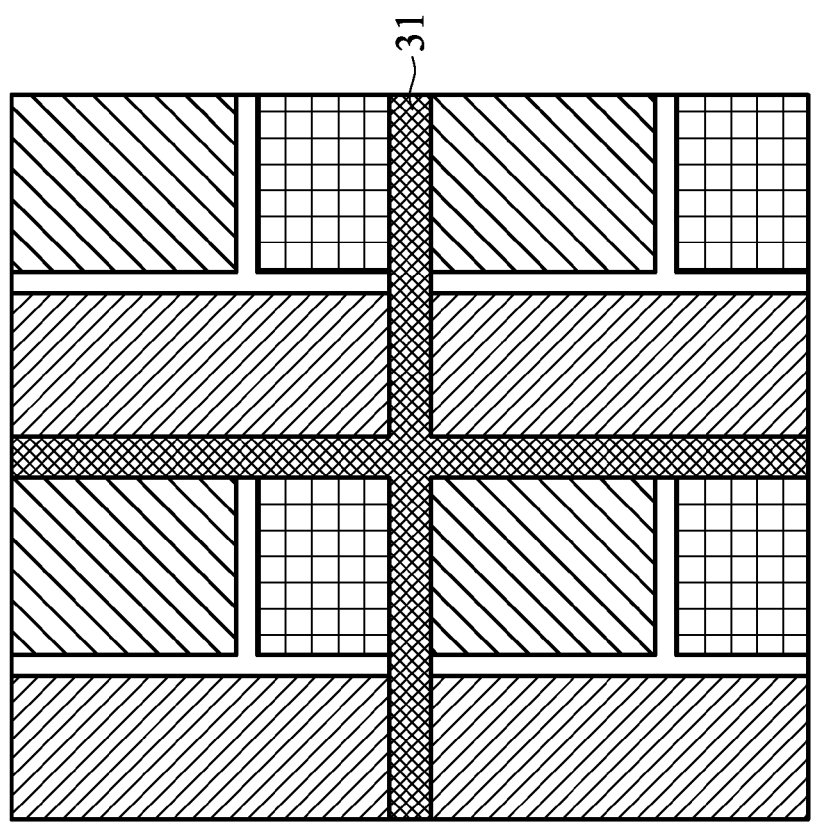

The concepts disclosed herein are not limited to multiple-LED dies forming one pixel. The concepts disclosed herein may be extended to multiple-pixel dies for an integrated photonic device. One color image pixel requires 3 LEDs, each generating a different color. While the multiple-LED dies described herein can be used as one color image pixel, one skilled in the art would note that the multiple-LED dies can be fairly large and form several color image pixels, or even an entire display. FIG. 8A shows a cross section showing at least two pixels 91 and 92 formed on the same substrate 31. Such multiple-pixel die can have four pixels as shown in FIG. 8B. The use of TSVs as internal electrodes and semiconductor processing techniques reduce the LED footprint allowing the distances between pixels to be made very small. The distance between pixels can be, for example, less than 1.2 mm, less than 1.0 mm, less than 0.8 mm, or even less than 20 microns. The multiple-pixel die can even be scaled to be the size of an entire wafer substrate, which would include thousands, millions, or even billion of LEDs depending on the size of the substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A photonic device operable to emit a full spectrum of lights including white light, said device comprising:
   a substrate;
   a first light emitting device (LED) on a first portion of the substrate, said first LED comprising a first light-emitting structure to emit a first light;
   a second LED on a second portion of the substrate, said second LED comprising a second light-emitting structure to emit a second light and a first phosphor layer to convert said second light to a third light, said second light being different from the third light;
   a third LED on a third portion of the substrate, said third LED comprising a third light-emitting structure to emit a fourth light and a second phosphor layer to convert said fourth light to a fifth light, said fourth light being different from the fifth light;
   a plurality of conductors electrically connected to a plurality of electrodes for individually controlling the first LED, the second LED, and the third LED, wherein the plurality of conductors include a first top through-substrate via (TSV), a second top TSV, a third top TSV, a first bottom TSV, a second bottom TSV, and a third bottom TSV, and wherein the first, second, and third top TSVs are electrically coupled to a portion of the first, second, and third LEDs above their light-emitting structures, respectively, and wherein the first, second, and third bottom TSVs are electrically coupled to a portion of the first, second, and third LEDs below their light-emitting structures, respectively; and,
   wherein the first light-emitting structure, the second light-emitting structure, and the third light-emitting structure include same materials and thickness.

2. The device of claim 1, wherein the third light is a red light; and wherein the fifth light is a green light.

3. The device of claim 2, wherein the first light, the second light, and the fourth light are blue lights.

4. The device of claim 2, wherein the first light, the second light, and the fourth light are UV lights and wherein the first LED further comprises a third phosphor layer to convert the first light to a blue light.

5. The device of claim 1, further comprising a lens disposed over all of the first LED, the second LED, and the third LED.

6. The device of claim 1, wherein the first, second, and third bottom TSVs are disposed below a portion of the first, second, and third light-emitting structures, respectively.

7. The device of claim 1, wherein the first portion, the second portion, and the third portion of the substrate have different areas.

8. The device of claim 1, wherein the first light-emitting structure, the second light-emitting structure, and the third light-emitting structure are grown simultaneously on the substrate.

9. A photonic device operable to emit a full spectrum of lights including white light, said device comprising:
   a substrate;
   a first light emitting device (LED) on a first portion of the substrate, said first LED comprising a first light-emitting structure to emit a first blue light;
   a second LED on a second portion of the substrate, said second LED comprising a second light-emitting structure to emit a second blue light and a first phosphor layer to convert said first blue light to a red light;
   a third LED on a third portion of the substrate, said third LED comprising a third light-emitting structure to emit a third blue light and a second phosphor layer to convert said third blue light to a green light, wherein the first, second, and third light-emitting structures have the same material compositions and layer configurations;
   a plurality of conductors electrically connected to a plurality of electrodes for individually controlling the first LED, the second LED, and the third LED, wherein the plurality of conductors are metals in a plurality of through-substrate vias (TSVs), said plurality of TSVs include a bottom TSV and a top TSV for each LED, and wherein the bottom TSV for the first LED, the second LED, and the third LED are electrically connected to each other; and
   a single lens disposed over all of the first LED, the second LED, and the third LED.

10. The device of claim 9, wherein the first portion, the second portion, and third portion of the substrate are proximate to each other.

11. The device of claim 9, further comprising a packaging substrate bonded to the substrate.

12. The device of claim 9, wherein the first light-emitting structure, the second light-emitting structure, and the third light-emitting structure come from a single wafer.

13. The device of claim 9, wherein the top TSV for each LED further comprises peripheral isolation layers to electrically isolate the conductor from the active layer.

14. The device of claim 9, further comprising a bonding layer between the substrate and the LEDs and wherein the substrate is a semiconductor substrate.

15. A photonic device operable to emit a full spectrum of lights including white light, said device comprising:
- a semiconductor substrate;
- a first light emitting device (LED) on a first portion of the substrate, said first LED comprising a first light-emitting structure to emit a first light;
- a second LED on a second portion of the substrate, said second LED comprising a second light-emitting structure to emit a second light and a first phosphor layer to convert said second light to a third light, said second light being different from the third light;
- a plurality of conductors electrically connected to a plurality of electrodes for individually controlling the first LED and the second LED, wherein the plurality of conductors include a first top through-substrate via (TSV), a second top TSV, a first bottom TSV, and a second bottom TSV, and wherein the first and second top TSVs are electrically coupled to a portion of the first and second LEDs above the first and second light-emitting structures, respectively, and wherein the first and second bottom TSVs are electrically coupled to a portion of the first and second LEDs below the first and second light-emitting structures, respectively; and,
- wherein the first light-emitting structure and the second light-emitting structure include same materials and thickness and layer configurations.

16. A photonic device operable to generate white light, said photonic device comprising:
- a growth substrate;
- a first light emitting device (LED) on a first portion of the growth substrate, said first LED comprising a first light-emitting structure to emit a first blue light or an ultra-violet (UV) light;
- a second LED on a second portion of the growth substrate, said second LED comprising a second light-emitting structure to emit a second blue or UV light and a first phosphor layer to convert said second blue or UV light to a yellow light;
- a plurality of conductors, said conductors electrically connected to a plurality of electrodes for individually controlling the first LED and the second LED, wherein the plurality of conductors are metals in a plurality of through-substrate vias (TSVs), said plurality of TSVs include a bottom TSV and a top TSV for each LED and wherein the bottom TSVs for the first LED and the second LED are electrically connected to each other; and,
- wherein the first light-emitting structure and the second light-emitting structure include the same materials and the same layer configurations.

17. The device of claim 16, wherein the first and second light are UV lights and the first LED further comprises a phosphor layer for converting the UV light to a blue light.

18. The device of claim 16, further comprising a packaging substrate bonded to the substrate.

19. The device of claim 16, further comprising a lens disposed over both of the first LED and the second LED.

* * * * *